United States Patent [19]

McFarlane et al.

[11] Patent Number: 5,290,730
[45] Date of Patent: Mar. 1, 1994

[54] WAVELENGTH CONVERSION WAVEGUIDE AND FABRICATION METHOD

[75] Inventors: Ross A. McFarlane; Mark Lui, both of Thousand Oaks, Calif.

[73] Assignee: Hughes Aircraft Company, Los Angeles, Calif.

[21] Appl. No.: 942,868

[22] Filed: Sep. 10, 1992

[51] Int. Cl.⁵ .................. H01L 21/20; H01S 3/16
[52] U.S. Cl. ....................... 437/129; 437/81; 437/105; 437/151; 423/489; 423/490; 423/499.1; 372/41; 372/69
[58] Field of Search ............... 437/129, 81, 105, 151; 423/489, 490, 499; 372/41, 69, 70, 71

[56] References Cited

U.S. PATENT DOCUMENTS

| | | | |
|---|---|---|---|
| 3,826,817 | 7/1974 | Pastor et al. | 423/499 |
| 3,932,597 | 1/1976 | Pastor | 423/499 |
| 3,935,302 | 1/1976 | Pastor et al. | 423/490 |
| 4,659,352 | 4/1987 | Robinson | 65/2 |
| 4,811,349 | 3/1989 | Payne et al. | 372/41 |
| 5,008,890 | 4/1991 | McFarlane | 372/41 |
| 5,022,040 | 6/1991 | Pollack et al. | 372/69 |
| 5,038,358 | 8/1991 | Rand | 372/69 |
| 5,086,432 | 2/1992 | Esterowitz et al. | 372/71 |
| 5,088,103 | 2/1992 | Esterowitz et al. | 372/68 |
| 5,105,434 | 4/1992 | Krupko et al. | 372/69 |
| 5,117,437 | 5/1992 | Rand | 372/91 |

OTHER PUBLICATIONS

Lui et al., "Critical Behavior of Epitaxial Antiferromagnetic Insulators: Interdigital Capacitance Measurements of Magnetic Specific Heat of $FeF_2$ Thin Films", Physical Review, B40, pp. 4898–4903 (1989).
Lui, "Molecular Beam Epitaxy and Magnetic Properties of Transition Metal Difluoride Films", Univ. of California at Santa Barbara, 1989, pp. 18–45.
Whitley et al, "Upconversion Pumped Green Lasing in Erbium Doped Fluorozirconate Fibre", Electronics Letters, vol. 27, No. 20, Sep. 26, 1991, pp. 1785–1786.
Bausa et al, "$Nd^{3+}$ Incorporation in $CaF_2$ Layers Grown by Molecular Beam Epitaxy", Appl. Phys. Lett., vol. 59, No. 2, Jul. 8, 1991, pp. 152–154.

Primary Examiner—Georgia Y. Epps
Attorney, Agent, or Firm—V. D. Duraiswamy; W. K. Denson-Low

[57] ABSTRACT

A radiation wavelength conversion device is implemented in the form of a waveguide that includes a single crystal halide-based cladding layer, and a halide-based active layer. The active layer has a greater refractive index than the cladding layer, is approximately lattice matched with the cladding layer, and includes a dopant that causes it to respond to input radiation at one wavelength by emitting radiation at a different wavelength. The active layer can either form part of a laser resonator cavity, or can operate through spontaneous emission. It is preferably about 3.5–5 microns thick to induce single-mode propagation, and can be divided into separate waveguiding channels to limit beam fanning. The device is operable at room temperature, and can be fabricated using conventional microelectronics techniques.

7 Claims, 5 Drawing Sheets

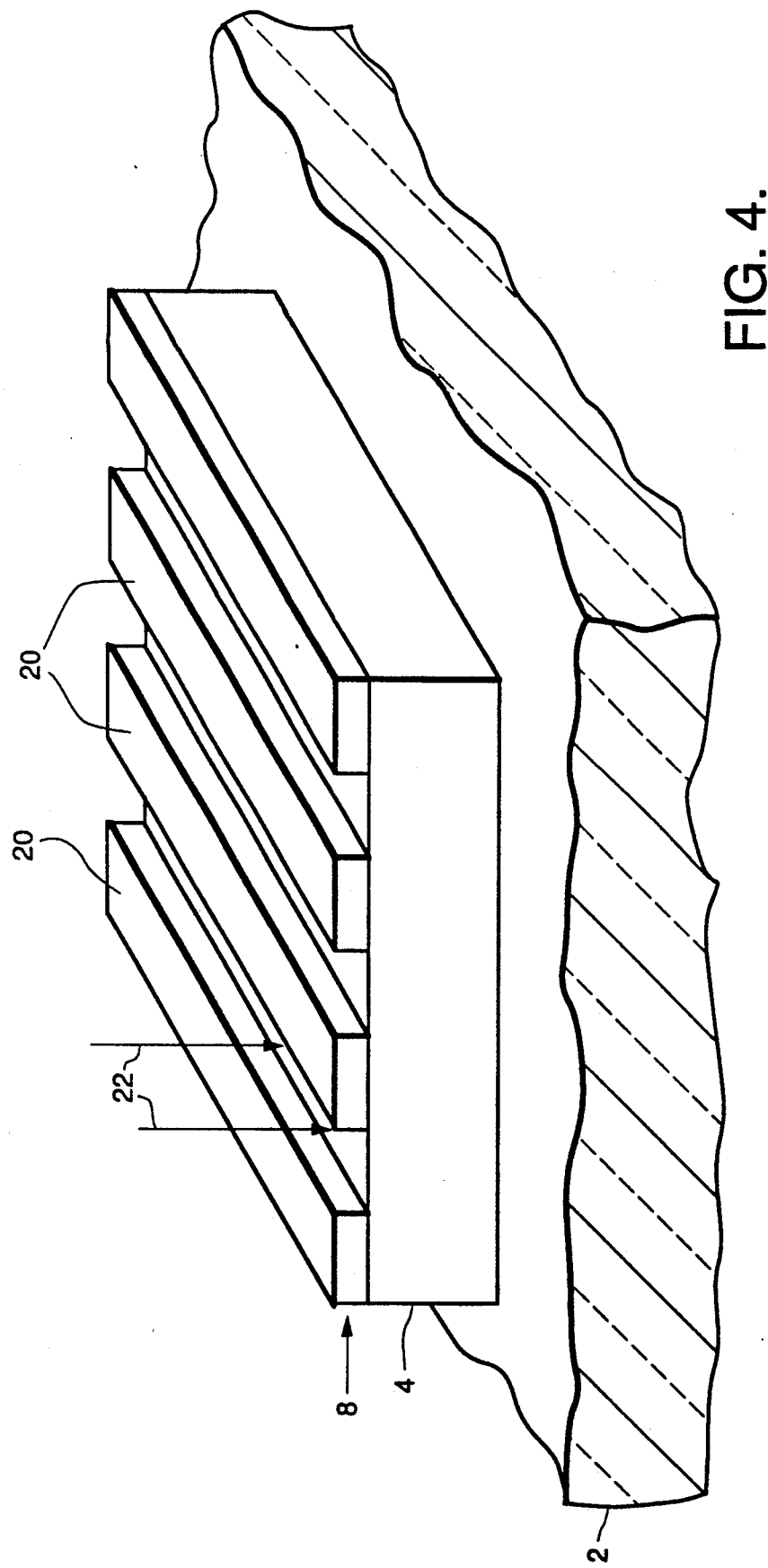

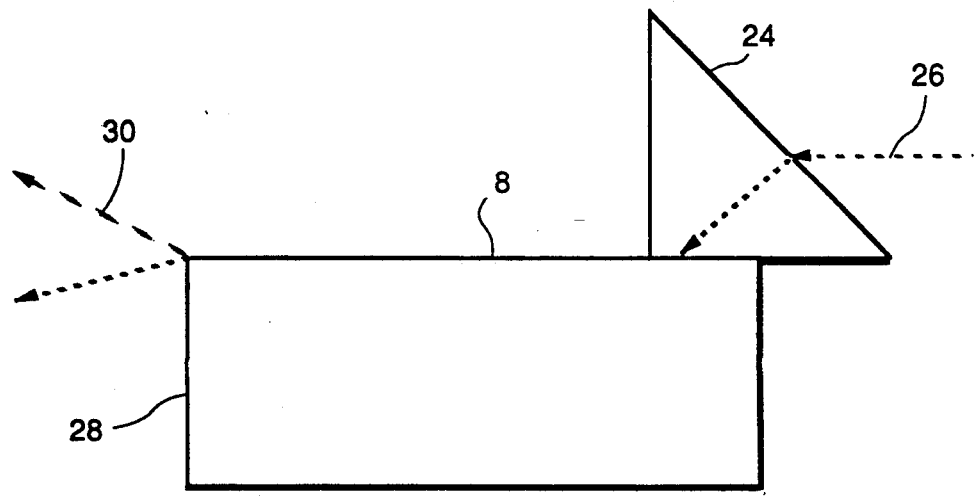
FIG. 5.
FIG. 6.
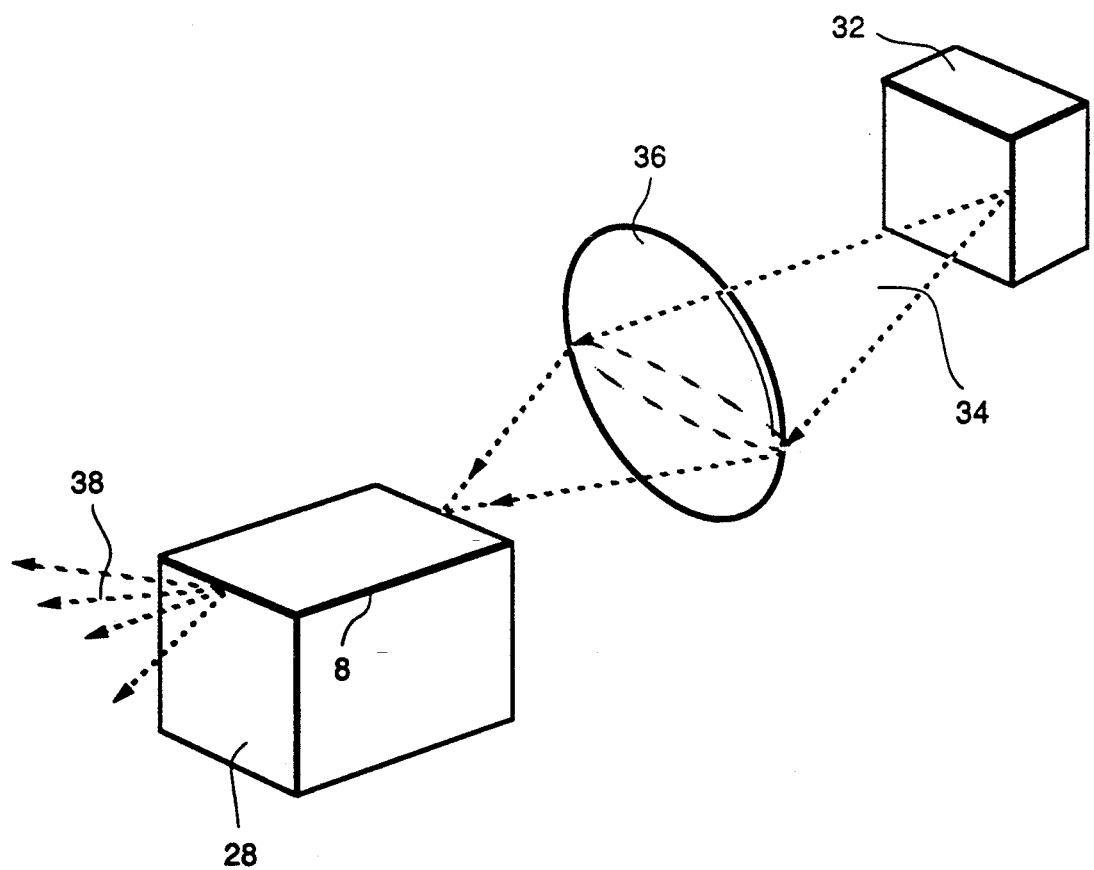

WAVELENGTH CONVERSION WAVEGUIDE AND FABRICATION METHOD

BACKGROUND OF THE INVENTION

1. Field of the Invention

This invention relates to optical devices that respond to input light at one wavelength by emitting light at a different wavelength, and more particularly to an upconversion waveguide and fabrication method that can be monolithically integrated on a semiconductor substrate.

2. Description of the Related Art

The excitation of rare earth ions in crystals and glasses has been used in the past to make infrared lasers in which the pump or excitation wavelengths are shorter than the laser output wavelength. For several ion types an energy sharing process takes place between excited ion pairs or triplets that result in a single ion being excited to an energy level greater than that of the pumping photons. This makes possible the operation of "upconversion" lasers that have outputs at wavelengths shorter than that of the pump source, including numerous different wavelengths in the ultraviolet and visible regions when driven by infrared sources. (Although typically used to produce an output with a wavelength shorter than the pump, the ion energy sharing can also be used with an appropriate nonradiative decay to produce a longer wavelength output; such "downconversion" systems are included within the generic term "upconversion" as used herein.)

Erbium doped fluoride crystals have recently been used as high power visible upconversion lasers. Such a device is discussed, for example, in U.S. Pat. No. 5,008,890 to McFarlane, assigned to Hughes Aircraft Company, the assignee of the present invention. Unfortunately, these devices must be operated at cryogenic temperatures, which requires a fairly complex and expensive system. In the McFarlane patent mentioned above, for example, the operating temperature range is restricted to 15°–120° K. The need for low temperatures arises from the fact that the excited ion population decays from the desired upper laser level via nonradiative mechanisms that are associated with the crystal lattice vibrations. This loss is reduced at lower operating temperatures because of a reduction of the phonon density in the host crystal.

An alternate to cryogenic operation is to offset the above loss by increasing the pump power density, and thereby compete directly with the losses by a more rapid pumping of the upper laser energy level. This has been achieved with single mode glass optical fibers that confine the energy of the pump source to a cylindrical region on the order of 5 microns in diameter. Because of the small fiber cross-section, the intensity of the pump beam within the fiber can be very high and thus avoid the need for cryogenic operation. An example of an upconversion device of this type is presented in Whitley et al., "Upconversion Pumped Green Lasing in Erbium Doped Fluorozirconate Fibre", *Electronics Letters*, Vol. 27, No. 20, 26 September 1991, pages 1785–1786. Visible laser operation has been reported at room temperature using erbium, thulium, holmium and praseodymium as dopant ions in special single mode fibers fabricated from heavy metal fluoride glass. While theoretically it might also be possible to obtain room temperature upconversion with a crystal, presently available cutting and polishing techniques are not capable of producing crystals with faces than less than about 200 square microns, which is not small enough for the high pump beam intensities necessary for room temperature operation.

Although the use of optical fibers avoids the need for cryogenic operation, it still has significant limitations. It is difficult to reliably draw the glass fiber into the small core dimensions that are required, and the fibers tend to degrade over time.

SUMMARY OF THE INVENTION

This invention seeks to provide an upconversion device with a crystalline structure that can be easily fabricated with currently available microelectronics fabrication techniques, is long lasting, and can be operated at room temperature.

These goals are accomplished by fabricating an upconversion device in the form of a waveguide, with an active region that is thin enough to achieve the high pump power densities necessary for upconversion at room temperature. The waveguide structure consists of a single crystal halide-based cladding layer upon which a planar halidebased active layer is formed. The active layer is approximately lattice matched with the cladding layer, has a refractive index greater than that of the cladding layer to assure a waveguiding action, and is doped with a rare earth or transition metal dopant that causes it to respond to input light at one wavelength by emitting light at a different wavelength. (The term "light" is used herein in a broad sense as including the full range of upconversion input and output radiation, and is not limited to visible light.) The upconversion waveguide is preferably monolithically integrated with a semiconductor substrate by growing both the cladding and active layers through molecular beam epitaxy (MBE). MBE provides the ability to grow high quality material to a thickness precision on the order of a monolayer (typically a few Angstroms), and this facility is not available employing other techniques such as liquid phase epitaxy (LPE). A pump diode laser for the upconversion device can be monolithically integrated on the same substrate, yielding a complete system that is very compact and inexpensive to manufacture.

While numerous different materials are available for the active and cladding layers, halide crystalline materials are preferred; a $CeF_3$ active layer on a $LaF_3$ cladding layer is of particular interest. The use of a $PbF_2$ active layer and a $SrF_2$ cladding layer is of significant interest as well. Of the group of rare earths in the periodic table, erbium, holmium, thulium, praseodymium neodymium and ytterbium are those preferred for this application. A reflective mirror is normally provided at one end of the active layer and a partially reflective mirror at the opposite end to induce a lasing action in response to a pump beam, although it is possible for the device to operate as a non-lasing upconversion light source without the use of mirrors.

To avoid a multi-mode light output that fans out beyond acceptable limits, and at the same time confine and focus the pumping energy to a region having a small cross section, the active layer can be formed as a plurality of mutually spaced, parallel waveguiding channels that extend along the cladding layer. The channels are preferably on the order of about 10 microns wide, and are preferably formed by ion milling. The active layer itself is preferably on the order of about 3.5–5 microns thick.

While different materials would commonly be used for the cladding and active layers, in certain cases it may also be possible to use the same material, with the dopant providing the required refractive index differential for waveguiding. An additional cladding layer can also be formed over the active layer for planarizing purposes.

These and other features and advantages of the invention will be apparent to those skilled in the art from the following detailed description, taken together with the accompanying drawings.

BRIEF DESCRIPTION OF THE DRAWINGS

FIG. 4 is a fragmentary perspective view illustrating the division of the upconversion waveguide into parallel channels; and FIGS. 5 and 6 are respectively elevation and perspective views of two different techniques for coupling a pump beam into a discrete upconversion waveguide that has been fabricated in accordance with the invention.

DETAILED DESCRIPTION OF THE INVENTION

Figure 1:
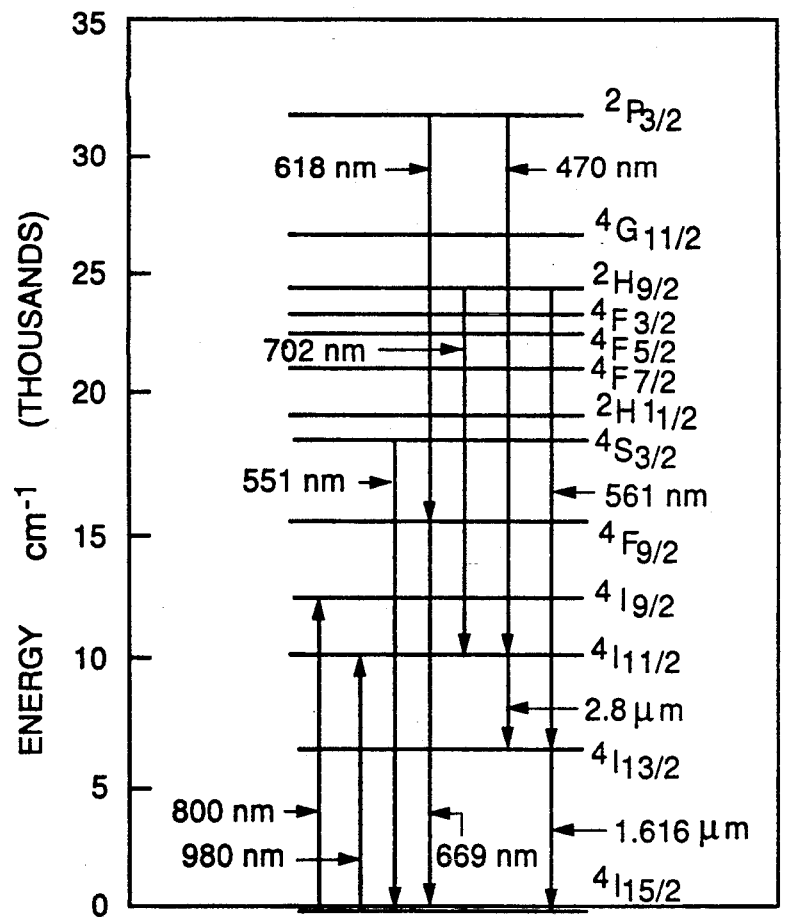
FIG. 1 is an energy diagram showing the potential for visible and ultraviolet emission from an infrared excitation of an erbium-doped upconversion device.
Figure 2:
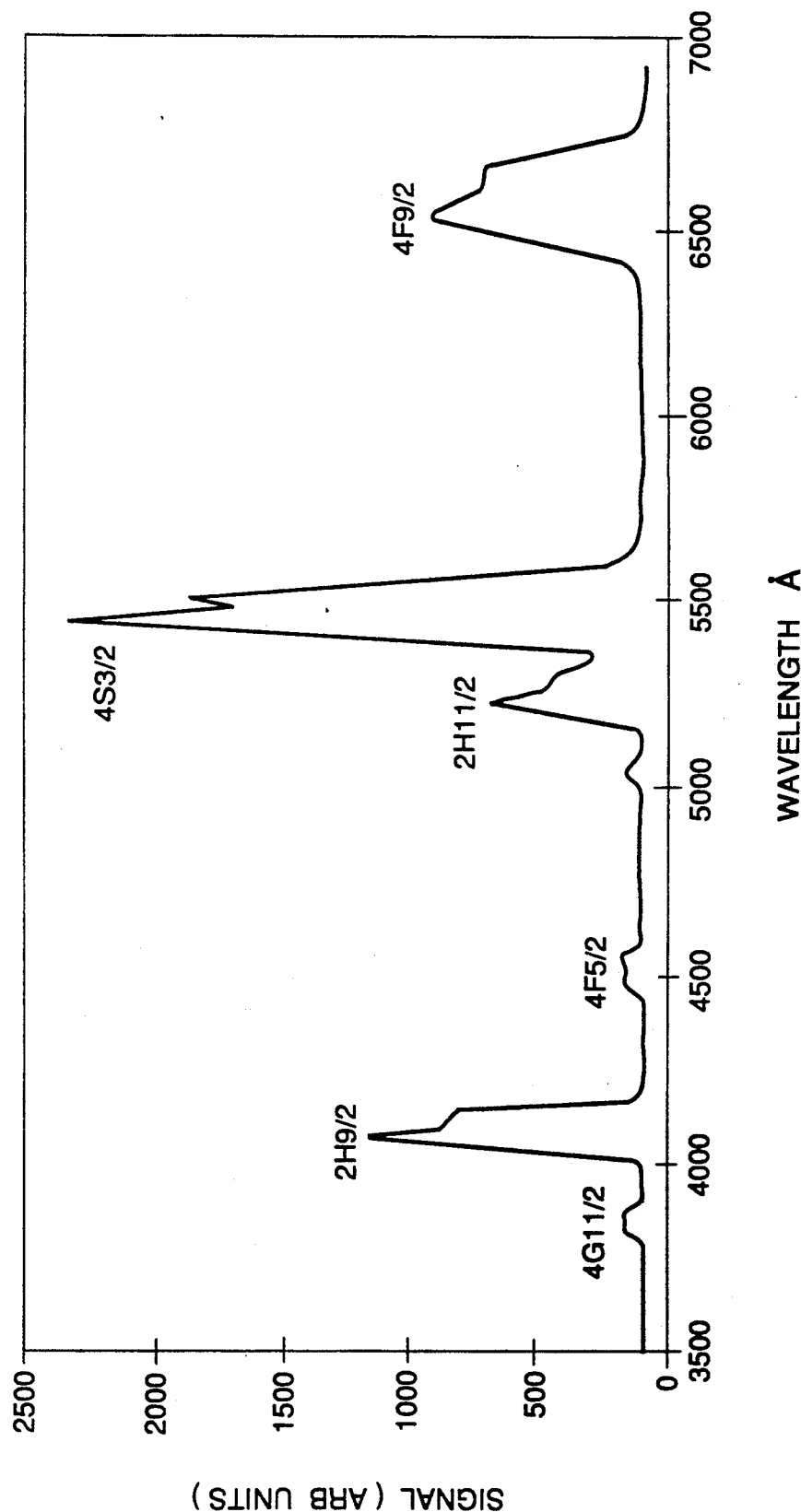
FIG. 2 is a graph showing the spectrum of the upconversion light emitted by the $Er^{3+}$ ion in the visible region when excited by infrared light.

The potential for visible and ultraviolet stimulated emissions from an erbium doped fluoride that is pumped with an infrared excitation is shown in the energy diagram of FIG. 1. These results have been obtained in the past with discrete erbium doped fluoride crystals, and are achievable with the present invention without the need for cryogenic operation that characterized the prior devices. Applying an 800 nm pump beam results in upconversion fluorescence at 410 nm, 551 nm and 669 nm. The relevant energy levels of the $Er^{3+}$ ion are shown in FIG. 1. Pairs of ions at the $^4I_{9/2}$ energy level share their energy when directly excited by the pump beam, and produce a population in the $^2H_{9/2}$ level. The decay of these ions to the $^4I_{15/2}$ level provides the source of the observed 410 nm emission, and can serve as an upper laser level population for a 410 nm laser. Nonradiative decay to the $^4F_{5/2}$, $^2H_{11/2}$, $^4S_{3/2}$ and $^4F_{9/2}$ levels leads to spontaneous emissions at 455 nm, 530 nm, 551 nm and 669 nm, respectively. FIG. 2 shows the spontaneous uV and visible emissions that were experimentally observed with an 800 nm infrared excitation.

The present invention provides a novel fluorescing medium in the form of a waveguide that has an active region dimension comparable to the optical fibers that have been previously used for upconversion lasers, thus enabling room temperature operation, but which can be easily constructed with common microelectronic fabrication techniques that are not subject to the degradation over time that has been experienced with optical fibers. The new upconversion device structure is particularly adapted to a monolithic integrated construction that allows it to be integrally formed on the same semiconductor substrate as associated electronic circuitry and/or the pump laser.

Figure 3A:
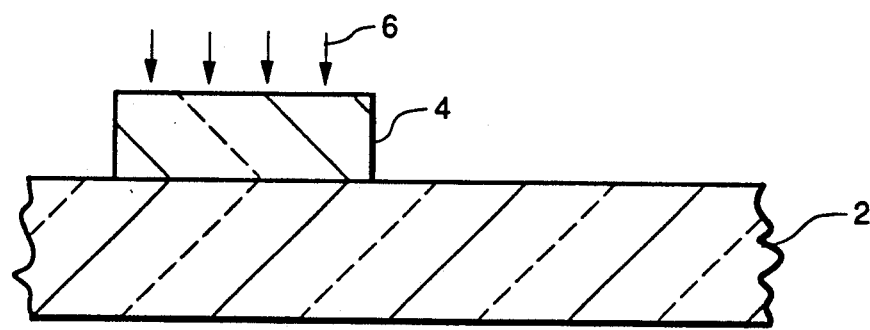
FIGS. 3a, 3b and 3c are simplified sectional views illustrating successive steps in the fabrication of an upconversion waveguide in accordance with the invention.
Figure 3B:
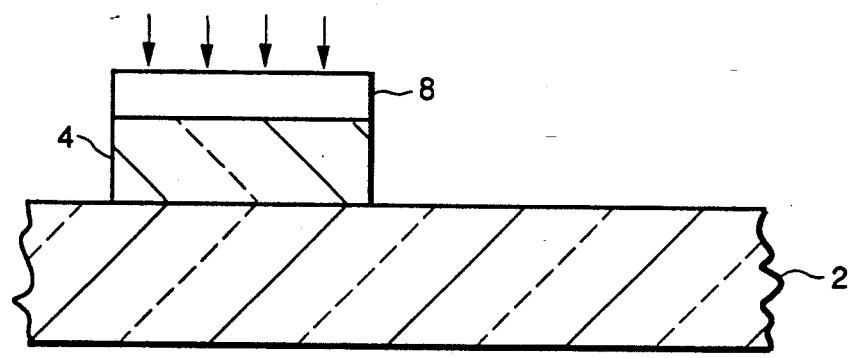
Figure 3C:
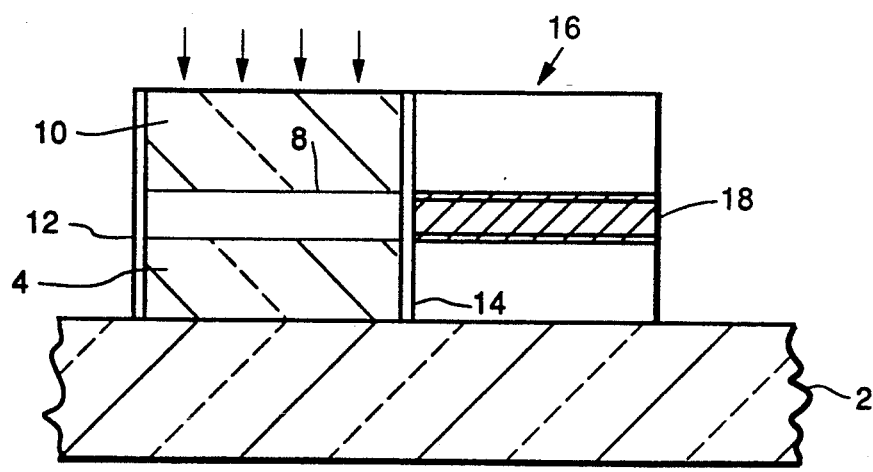

A preferred fabrication technique for the new upconversion structure is illustrated in FIGS. 3a-3c. Referring first to FIG. 3a, the device is grown upon a suitable substrate 2. This is preferably a semiconductor material that can also bear related electronic circuitry, allowing the upconversion device to be monolithically integrated with the circuitry. GaAs is particularly desirable as a substrate material if a visible emission is desired, since diode pump lasers that radiate at 800 nm (a suitable IR wavelength for upconversion to the visible spectrum), can be implemented in GaAs.

A single crystal halide cladding layer 4 is grown by MBE upon the substrate 2. Either the entire substrate can be coated and then photolithographically patterned to produce the desired cladding layer, or the MBE can be performed through a mask. The flow of molecules towards the substrate to grow the cladding layer is indicated by arrows 6. Specific materials that can be used for this layer are discussed below, but at this point it can be said that the cladding layer material should be halide-based and have a near lattice matching with the substrate material.

In the next step of the fabrication process, illustrated in FIG. 3b, a waveguide active layer 8 is grown upon the cladding layer 4, and simultaneously doped with a rare earth dopant. To this end the active layer material and dopant ions are co-deposited in the MBE process to the desired dopant concentration. Doping a fluoride crystal with a rare earth dopant by means of MBE has been disclosed in Bausa et al., "$Nd^{3+}$ Incorporation in $CaF_2$ Layers Grown by Molecular Beam Epitaxy", *Applied Physics Letters*, Vol. 59, No. 2, 8 Jul. 1991, pages 152-154. In this reference, however, the crystal substrate was formed from a material that was identical to the material deposited by MBE, and there was no report of any refractive index differential that could have produced a waveguiding action. No upconversion fluorescence was reported, and the fluoride materials preferred in the present invention cannot be grown from the boron nitride crucibles used in the Bausa et al. reference because fluorides react with the boron nitride and release nitrogen, leading to very poor quality material. With the present invention, by contrast, the material used for the active layer 8 is deliberately selected to have a higher refractive index than the cladding layer 4. This is normally accomplished by selecting different materials for the active and cladding layers, although in some cases it may be possible to use the same material for both layers and achieve the necessary refractive index differential through the doping process.

Although the active layer 8 could be grown over a fairly wide range of thicknesses and still achieve waveguiding action, a thickness in the approximate range of 3.5-5 microns is desirable because it results in propagation in a single transverse mode. Furthermore, with currently available technology it would be difficult to couple a pump beam into a thinner waveguide layer.

The MBE growth should be performed in an ultra high vacuum of less than $10^{-9}$ Torr to allow growth to take place in the molecular regime, and also to enable in situ oxide removal by heat cleaning. The source material should ideally not disassociate during the vaporization (evaporation or sublimation) process, and should be of high purity for epitaxial film growth. It is preferably purified by processing in a reactive environment, such as annealing fluorides under HF. Reactive atmosphere processing (RAP) methods are discussed in U.S. Pat. Nos. 3,826,817, 3,932,597, 3,935,302 and 4,659,352, all assigned to Hughes Aircraft Company, the assignee of the present invention. The substrates must be properly prepared for MBE growth; epitaxial-ready GaAs and InP wafers are commercially available, while other wafers should be mechanically polished, etched polished and etched. The substrate is held at an elevated temperature for epitaxial growth to take place. The temperature requirements are material dependent, but typically exceed 200° C. for fluorides. Growth rates for MBE are typically about 1 micron per hour.

FIG. 3c illustrates the results of several additional fabrication steps. An optional upper cladding layer 10, preferably of the same material as the lower cladding layer 4, is shown having been grown by MBE over the active layer 8. Although it is illustrated as being limited to the size of the underlying active and lower cladding layers, an upper cladding layer 10 might be desired for planarizing purposes, in which case it would extend over the entire substrate surface. Another purpose of an upper cladding layer would be as a protective film.

An upconversion waveguide that is fabricated in this manner is most commonly operated as a laser, in which case a partially reflective dielectric mirror 12 is deposited at the output end of the active layer, and a fully reflective dielectric mirror 14 is deposited at the opposite end of the active layer. Mirror 14 is highly reflecting at the laser operating wavelength(s) but transmits at the pump wavelength and thus allows a pump beam to be transmitted into the active layer. Alternately, for certain materials the waveguide may respond to a pump beam with a spontaneous upconversion emission, without a lasing action. In this case the mirrors 12 and 14 would be omitted, and the active layer would produce an output directly in response to a received pump beam.

The experiment that resulted in the emissions shown in FIG. 2 employed (001) $MgF_2$ substrates that were carefully aligned with the c-axis perpendicular to the face, using an X-ray Laue Camera. The substrates were mechanically polished using diamond paste. A combined mechanical chemical etching technique was used as the last polishing step to remove damage left by the mechanical polishing steps. A 20% HCl solution was used in conjunction with an etch polishing system, and a final free etch in 20% HCl solution was used before loading the substrate into the vacuum chamber. The desirability of such an elaborate polishing scheme is made clear in the capacitance studies made on $FeF_2$ epitaxial films, as discussed in Lui et al., "Critical Behavior of Epitaxial Antiferromagnetic Insulators: Interdigital Capacitance Measurements of Magnetic Specific Heat of $FeF_2$ Thin Films", *Physical Review*, B40, pages 4898–4903 (1989).

$ZnF_2$:ER epitaxial films were grown in an MBE chamber. This system was essentially an MBE machine, but without many of the in situ characterization features and sophisticated control setup that would be used for the growth process in practice. Growth took place in an ultra high vacuum (less than $10^{-9}$ Torr) chamber. The oxide layer was removed by heating the substrate in an oxygen free environment, thereby vaporizing any residue oxygen on the surface. A cryoshroud was installed in the chamber to reduce outgassing during the heating processes. High quality source material, which is necessary for epitaxial film growth, was purified by sintering under an HF environment; the HF reduces any impurities in the fluoride materials. The source materials were evaporated/sublimed from a heated carbon crucible which had been previously pyrolized and fired under vacuum to a temperature higher than the growth conditions.

The $MgF_2$ substrate oxide layer was removed by heating to 550° C. for 20 minutes. A 1 $\mu$m $MgF_2$ buffer layer was grown with the substrate at 350° C. to improve surface quality for the final epitaxial layer, a common practice in MBE. A 1 $\mu$m $ZnF_2$:Er layer was grown using a $ZnF_2$ and $ErF_3$ source simultaneously with the substrate held at 300° C. by use of a quartz crystal oscillator; the Er doping was estimated to be approximately 20%. The growth conditions in general followed those set forth in a thesis by Lui, one of the present inventors, "Molecular Beam Epitaxy and Magnetic Properties of Transition Metal Difluoride Films", University of California at Santa Barbara, 1989, pages 18–45.

One of the advantages of the invention is that it can be monolithically integrated with a diode laser on the same substrate that provides a pump beam for the upconversion waveguide. Such a diode laser 16 is illustrated in FIG. 3c as being fabricated adjacent to the waveguide structure, with the laser's active region 18 aligned with the waveguide active region 8 so that it emits a pump beam directly into the waveguide. Other geometries for transferring the output from the laser diode to the waveguide active layer could also be envisioned, such as coupling the pump beam through a separate cladding layer.

An upconversion waveguide fabricated in this manner will typically have an active length on the order of 2 to 10 mm, although there is a fairly wide latitude in width A multi-mode visible output emission resulted, with the emission fanned out laterally to a considerable extent. This problem was resolved by channelizing the active layer into a plurality of parallel waveguides, each of which was much narrower and did not exhibit the output fanning. Such a structure is shown in FIG. 4. The active layer 8 is shown divided into a plurality of discrete parallel channels 20. The channel widths are preferably selected to inhibit multi-mode outputs; a width on the order of 10 microns is suitable for this purpose. The channels can be formed by first fabricating an uninterrupted active layer 8, and then ion milling away the regions between the desired channels; the ion milling process is indicated by arrows 22. Wet etching is another possible process that might be used to create the channels. After the channels have been formed, the structure can be divided into individual waveguide elements by cleaving.

Channelizing the active layer adds an extra degree of flexibility in the use of the upconversion device. Separate pump beams could be provided for the separate channels of each array, or the different channels could be uniquely doped, to obtain different emission spectra from each channel. Varying the geometries of the different channels to individualize their propagation modes, or for other purposes, is another possibility.

It is important for successful epitaxial growth that the active layer be approximately lattice matched with the cladding layer, and that the cladding layer be approximately lattice matched with the underlying substrate. Although in theory the cladding layer could be omitted and the active layer grown directly on the substrate if the difference in refractive indexes were correct, in practice the refractive index of desirable substrate materials such as GaAs, silicon and InP is higher than for the halides that can be used for the active layer. The use of an intermediate cladding layer, with a lower refractive index than the active layer, is thus required for such materials.

The following fluorides have lattice constants that make them suitable for use as cladding or active layers in connection with GaAs (111) or silicon (111) substrates: $LaF_3$, $CeF_3$, $NdF_3$ and $YbF_3$. Of these, the use of $CeF_3$ as an active layer on a $LaF_3$ cladding appears to be particularly attractive. $CeF_3$ has a slightly higher refractive index than $LaF_3$ over the spectrum of highest current interest, which is about 0.3–3 microns. The materials have desirably low phonon energies, and rare earth dopants will occupy sites substitutionally rather than interstitially.

The following fluorides have lattice constants that make them suitable for use as cladding or active layers on GaAs(100) (lattice constant a=5.65), silicon(100-)(a=5.43) or InP(100)(a=5.87):$CaF_2$(a=5.46, refractive index n=1.43), $BaF_2$ (a=6.20, n=1.47), $SrF_2$(a=5.80, n=1.44) and $PbF_2$(a=5.93, n=1.70). The latter two, $PbF_2$ and $SrF_2$, are the preferred choices for the active and cladding materials for GaAs (100). The following fluorides and other halides are candidates for homoepitaxy, in which the same material would be used for both the active and cladding layers, with the refractive index differential resulting from doping the active layer: $YLiF_4$, $BaY_2F_8$, $CsCdBr_3$, $CsMgCl_3$ and $Cs_3Yb_2Br_9$. Although the above materials are not intended to be exclusive of the halides that can be employed for the active or cladding layers, they appear to be the most promising at present.

The rare earth dopants may be incorporated into the active layer either singly or in pairs. The selection of the particular dopant or dopants is primarily responsible for determining the emission spectra of a particular upconversion waveguide. Single rare earth dopants that can be used are erbium, holmium, thulium, praseodymium, neodymium and ytterbium; co-dopants include ytterbium:erbium, ytterbium: thulium and thulium:-praseodymium. Transition metal dopants can also be used. Examples of transition metal dopants are Cr, Ti, Mn, V, Fe, Co and Ni singly, and Cr:Nd and Cr:Er as co-dopants. Transition metals can also be introduced into the MBE films either as the active laser ion for tunable sources, or as a donor that transfers energy to a rare earth active ion. These two operational aspects arise from the presence of broad absorption and emission spectral structures of transition metals. Both have been exploited in bulk laser crystal pumped by flash lamps, and may be equally significant for waveguide systems that can be tuned over a wide wavelength range or excited by broad band diode lasers that do not need line narrowing to achieve efficient pump absorption.

When the upconversion device is not monolithically integrated with a pump laser diode, various schemes may be envisioned for coupling a pump beam into the active layer. FIG. 5 illustrates one such arrangement. A coupling prism 24 is placed over the input end of the active region 8 and deflects a long wavelength input pump beam 26 into the active region 8. The input radiation is trapped by the waveguide active region, which is deposited upon a substrate or cladding layer 28. Upconversion occurs within the waveguide active layer 8, and short wavelength radiation 30 emerges at the output end of the active layer.

An alternate arrangement is illustrated in FIG. 6, which eliminates the need for a coupling prism and is easier to miniaturize. An end firing solid state laser 32 projects an elliptical infrared radiation cone 34 into a focusing lens 36, which in turn concentrates the radiation onto the edge of the waveguide layer 8 on the substrate 28. The upconverted short wavelength radiation 38 emerges at the opposite end.

The invention thus provides room temperature upconversion, without the limitations of the optical fiber upconversion devices discussed previously. While several illustrative embodiments of the invention have been shown and described, numerous variations and alternate embodiments will occur to those skilled in the art. For example, the upconversion waveguide system can have various structures for the laser gain medium and its relation to the mirrors at either end. These include a planar waveguide, a channel waveguide, distributed feedback over the length of the channel, distributed Bragg reflectors at the channel ends, and cleaved mirrors which are particularly easy to implement for semiconductor substrates. Such variations and alternate embodiments are contemplated, and can be made without departing from the spirit and scope of the invention as defined in the appended claims.

We claim:

1. A method of fabricating a light source that responds to a pump beam at one wavelength by emitting radiation at another wavelength, comprising:

growing a planar halide-based active layer upon a single crystal halide-based cladding layer by molecular beam epitaxy (MBE), said active layer being approximately lattice matched with said cladding layer, and using said MBE step to simultaneously dope said active layer with a rare earth dopant, said doped active layer being grown to have a higher refractive index than, and form a waveguide with, said cladding layer.

2. The method of claim 1, wherein prior to growing said active layer, said cladding layer is grown by MBE on a semiconductor substrate with which it is approximately lattice matched.

3. The method of claim 2, further comprising the step of monolithically fabricating a diode laser on said substrate to provide a pump beam for said light source.

4. The method of claim 1, further comprising the step of forming a full reflector at one end of said active layer and a partial reflector at the other end of said active layer to establish said reflectors and the intervening active layer as a laser cavity.

5. The method of claim 1, further comprising the step of dividing said active layer into a plurality of mutually spaced, parallel waveguiding channels.

6. The method of claim 5, wherein said active layer is divided into channels that are on the order of about 10 microns wide.

7. The method of claim 5, wherein said channels are formed by ion milling the areas of the active layer between the channels.

* * * * *